(12) United States Patent
Halimaoui et al.

(10) Patent No.: US 9,356,094 B2
(45) Date of Patent: May 31, 2016

(54) METHOD FOR MAKING A SEMI-CONDUCTING SUBSTRATE LOCATED ON AN INSULATION LAYER

(71) Applicant: STMicroelectronics (Crolles 2) SAS, Crolles (FR)

(72) Inventors: Aomar Halimaoui, La Terasse (FR); Daniel Bensahel, Grenoble (FR)

(73) Assignee: STMicroelectronics (Crolles 2) SAS, Crolles (FR)

(*) Notice: Subject to any disclaimer, the term of this patent is extended or adjusted under 35 U.S.C. 154(b) by 80 days.

(21) Appl. No.: 13/907,547

(22) Filed: May 31, 2013

(65) Prior Publication Data
US 2013/0264678 A1 Oct. 10, 2013

Related U.S. Application Data

(62) Division of application No. 12/679,271, filed as application No. PCT/FR2008/051717 on Sep. 26, 2008, now Pat. No. 8,536,027.

(30) Foreign Application Priority Data
Sep. 28, 2007 (FR) ...................... 07 57916

(51) Int. Cl.
| H01L 21/20 | (2006.01) |
| H01L 29/02 | (2006.01) |
| H01L 29/06 | (2006.01) |
| H01L 21/762 | (2006.01) |
| H01L 21/764 | (2006.01) |
| H01L 21/02 | (2006.01) |

(52) U.S. Cl.
CPC .......... *H01L 29/0649* (2013.01); *H01L 21/764* (2013.01); *H01L 21/76262* (2013.01); *H01L 21/02381* (2013.01); *H01L 21/02532* (2013.01); *H01L 21/02658* (2013.01)

(58) Field of Classification Search
USPC ............ 257/347, 522, 618, E21.09, E29.002; 438/458, 478, 479
See application file for complete search history.

(56) References Cited

U.S. PATENT DOCUMENTS

| 2004/0245571 A1 | 12/2004 | Cheng et al. |
| 2005/0133865 A1* | 6/2005 | Ikeda et al. .................. 257/347 |
| 2007/0001227 A1* | 1/2007 | Barbe et al. .................. 257/347 |
| 2007/0215916 A1 | 9/2007 | Minami et al. |

FOREIGN PATENT DOCUMENTS

WO WO 2004073043 A 8/2004

OTHER PUBLICATIONS

International Search Report dated Mar. 31, 2009 from a corresponding International Application No. PCT/FR2008/051717.

* cited by examiner

*Primary Examiner* — Lynne Gurley
*Assistant Examiner* — Vernon P Webb
(74) *Attorney, Agent, or Firm* — Seed IP Law Group PLLC

(57) ABSTRACT

A method for making a silicon layer extending on an insulation layer, including the steps of forming a silicon-germanium layer on at least a portion of a silicon wafer; transforming portions of the silicon-germanium layer into porous silicon pads; growing a monocrystalline silicon layer on the silicon-germanium layer and on the porous silicon pads; removing the silicon-germanium layer; oxidizing the porous silicon pads; and depositing an insulation material on the silicon layer.

24 Claims, 2 Drawing Sheets

METHOD FOR MAKING A SEMI-CONDUCTING SUBSTRATE LOCATED ON AN INSULATION LAYER

CROSS REFERENCE TO RELATED APPLICATIONS

This application is a division of U.S. patent application Ser. No. 12/679271, filed on Mar. 19, 2010, which claims the priority benefit of PCT Application No. PCT/FR2008/051717, filed on Sep. 26, 2008, and which application claims priority to French Patent Application No. 07/57916, filed on Sep. 28, 2007, and which applications are hereby incorporated by reference to the maximum extent allowable by law.

BACKGROUND OF THE INVENTION

1. Field of the Invention

The present invention relates to structures comprising a semiconductor substrate formed locally on a semiconductor wafer with an interposed insulating layer and, more specifically, to a method for manufacturing such a structure.

2. Discussion of the Related Art

Currently, semiconductor components are formed either in a solid semiconductor wafer, or in a semiconductor layer formed on an insulating layer, these latter substrates being generally called SOI substrates (for "Silicon On Insulator").

Substrates formed on a semiconductor support with an interposed insulating layer have the advantage of enabling for the components formed in and on these substrates to be insulated from the support, which avoids biasing said support and avoids interference between the components via the support. A disadvantage of known methods for manufacturing such substrates is that these substrates are formed on an entire surface of the support.

SUMMARY OF THE INVENTION

An embodiment of the present invention aims at a method for manufacturing, on a semiconductor wafer, a local structure formed of a portion of semiconductor layer formed on an insulating layer portion.

Thus, an embodiment provides a method for manufacturing a silicon layer extending on an insulating layer, comprising the steps of: forming a silicon-germanium layer on at least a portion of a silicon wafer; transforming portions of the silicon-germanium layer into porous silicon pads; growing a single-crystal silicon layer on the silicon-germanium layer and on the porous silicon pads; eliminating the silicon-germanium layer; oxidizing the porous silicon pads; and depositing an insulating material under the silicon layer.

According to an embodiment, the transforming of the portions of the silicon-germanium layer into porous silicon pads comprises the steps of: forming, on the silicon-germanium layer, a mask comprising openings; performing an electrolysis of the silicon-germanium layer; and removing the mask.

According to an embodiment, the transforming of the portions of the silicon-germanium layer into porous silicon pads comprises the steps of: forming, on the silicon-germanium layer, a mask comprising openings; etching the silicon-germanium layer down to the silicon wafer at the level of the openings; growing by epitaxy silicon portions on the wafer in the etched portions of the silicon-germanium layer; performing an electrolysis of the silicon portions; and removing the mask.

According to an embodiment, the thickness of the silicon layer and the thickness of the insulating layer range between 10 and 20 nm.

According to an embodiment, the porous silicon pads have dimensions smaller than 1 µm and are spaced apart from one another by 10 µm.

An embodiment further provides a structure comprising a silicon layer hung above a silicon wafer by porous silicon pads.

BRIEF DESCRIPTION OF THE DRAWINGS

The foregoing and other objects, features, and advantages of the present invention will be discussed in detail in the following non-limiting description of specific embodiments in connection with the accompanying drawings.

For clarity, the same elements have been designated with the same reference numerals in the different drawings and, further, as usual in the representation of semiconductor structures, the various drawings are not to scale.

DETAILED DESCRIPTION

Successive steps of a method for obtaining a single-crystal silicon layer on an insulating layer resting on a silicon wafer according to an embodiment will be described in relation with FIGS. 1A to 1H.

Figure 1A:
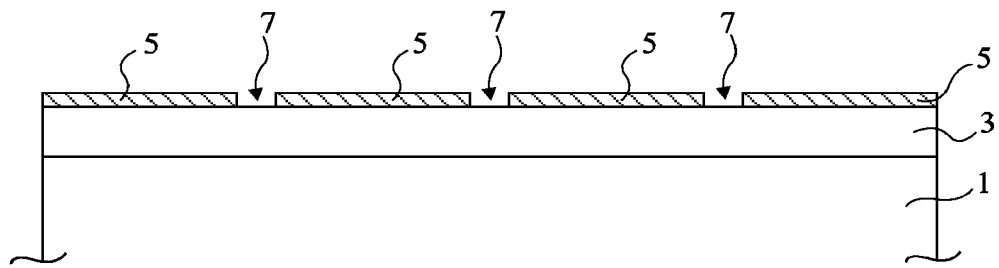
FIGS. 1A and 1C to 1H are cross-section views illustrating steps of a method according to an embodiment of the present invention, FIG. 1B being a top view corresponding to the cross-section view of FIG. 1A.
Figure 1B:
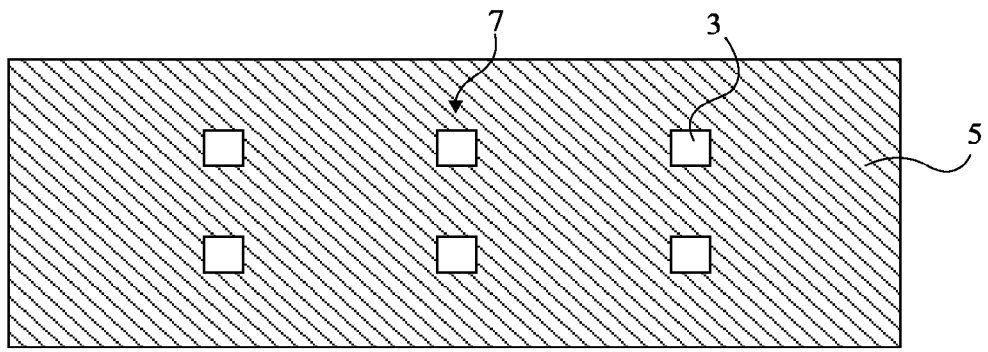

As illustrated in FIGS. 1A and 1B, respectively in cross-section view and in top view, it is started from a silicon wafer 1 on which a local silicon-germanium layer 3 is to formed. As an example, silicon-germanium layer 3 may be formed by epitaxial growth under a gas flow, for example, of silane and germane. Also as an example, layer 3 may have a thickness ranging between 10 and 20 nm. A mask 5 is then formed above silicon-germanium layer 3. Mask 5 comprises openings 7 nearly in the form of points and, preferably, regularly spaced apart. In the example of FIG. 1B, openings 7 are, in top view, small squares. As an example, openings 7 may have dimensions of approximately 1 µm and be spaced apart by a distance of approximately 10 µm. Mask 5 may be formed by the deposition of an insulating layer of the silicon-germanium layer, followed by the deposition of a resist which is insolated through a pattern comprising adapted openings. The insolated resist is etched and the insulating layer is then etched at the level of the resist openings. The resist layer is then removed. This method enables forming a mask 5 of an insulating material, presently called a "hard mask".

Figure 1C:
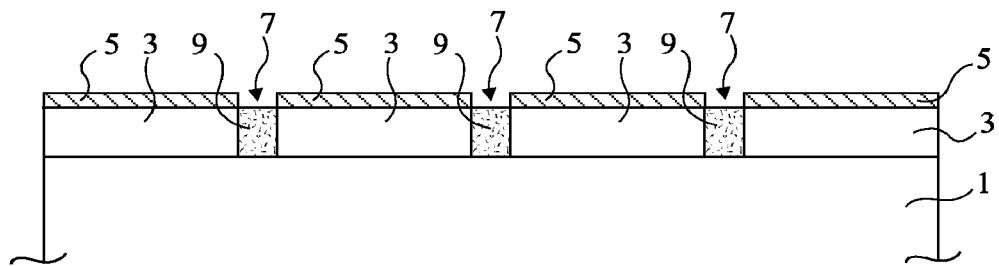

At the step illustrated in FIG. 1C, an electrolysis has been performed. This electrolysis transforms the portions of silicon-germanium layer 3 located opposite to openings 7 of mask 5 into porous silicon 9. It should be noted that, generally, during the electrolysis, the germanium atoms in the transformed portions of silicon-germanium layer 3 migrate in the electrolytic liquid, whereby porous material 9 is essentially silicon.

As a variation, to obtain the structure of FIG. 1C from the structure of FIGS. 1A and 1B, it is possible to carry out the successive steps of:

etching silicon-germanium layer 3 at the level of openings 7 down to silicon wafer 1 (for example, by plasma etch);

growing, by selective epitaxy, silicon portions on silicon wafer 1 in the previously-formed openings; and performing an electrolysis of the silicon portions thus formed to transform them into porous silicon 9.

As compared with the steps of the previously-described method in which silicon-germanium layer 3 is directly transformed into porous silicon 9 at the level of openings 7 of mask 5, this variation has the advantage of enabling a greater flexibility in the selection of the used technologies.

Figure 1D:
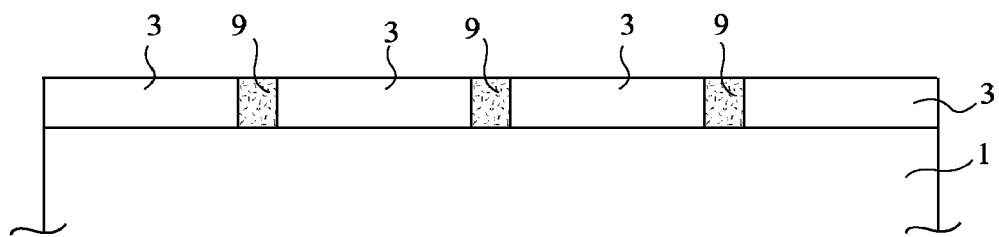

At the step illustrated in FIG. 1D, mask 5 has been removed, for example, by etching.

Figure 1E:
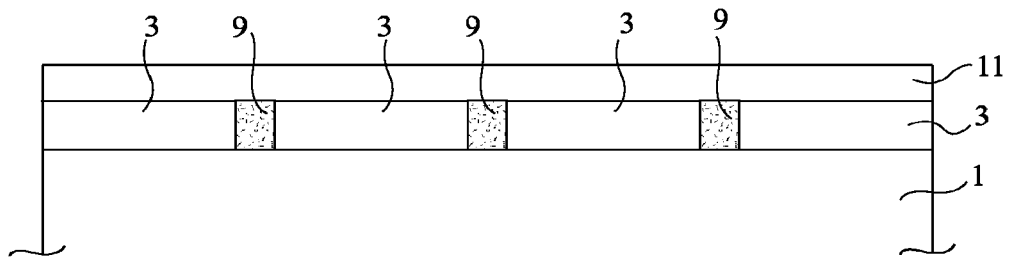
Figure 1F:
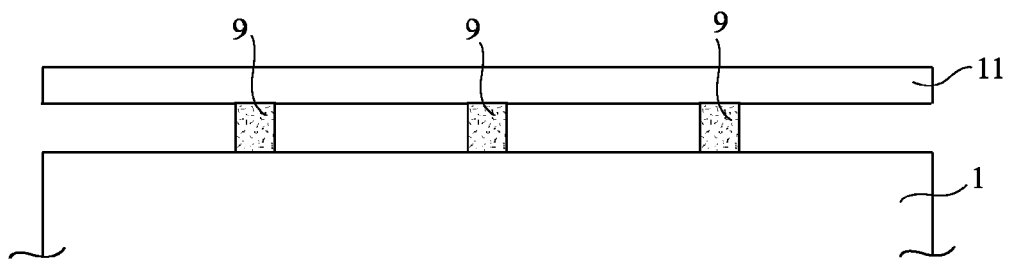

At the step illustrated in FIG. 1E, a single-crystal silicon layer 11 has been grown by epitaxy over silicon-germanium layer 3 and porous silicon portions 9 altogether. Silicon layer 11 forms the substrate in and on which electronic components will be formed. The growth by epitaxy of single-crystal silicon layer 11 is possible since porous silicon portions 9 keep the initial crystal structure of the silicon-germanium of layer 3. As an example, silicon layer 11 may have a thickness ranging between 10 and 20 nm At the step of FIG. 1F, silicon-germanium layer 3 has been eliminated by selective etching with respect to porous silicon 9 and to the single-crystal silicon of wafer 1 and of layer 11. This etching may be a plasma etching and it may be performed from the sides of silicon-germanium portion 3 or via openings, not shown, formed in silicon layer 11. A structure comprising a silicon layer 11 hung above silicon wafer 1 by porous silicon pillars or pads 9 is thus obtained.

Figure 1G:
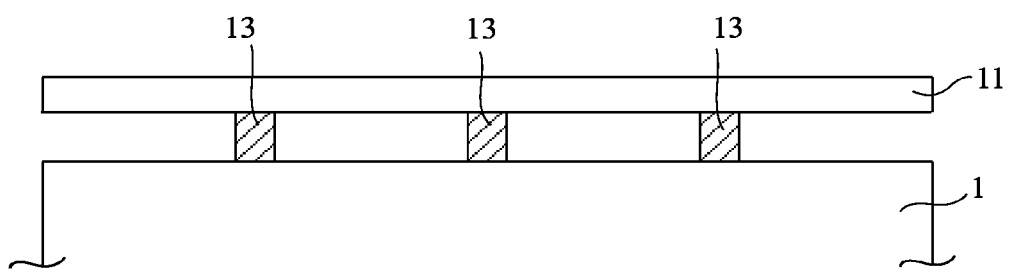

At the step of FIG. 1G, an oxidation of the porous silicon of pads 9 has been carried out. Pads 9 are thus transformed into silicon oxide pads 13. The oxidation may comprise a first low-temperature oxidation step (300-400° C.) for a time period of approximately one hour under an oxygen flow, followed by a second oxidation step at higher temperature (700-800° C.). These two steps enable stabilizing the oxidized porous silicon structure and preventing its degradation.

Figure 1H:
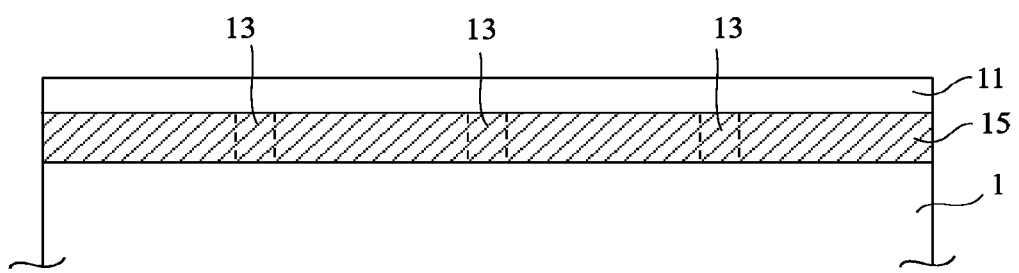

FIG. 1H shows the structure obtained after having filled the empty space under silicon layer 11 with an insulator 15. This filling of the space under layer 11 between pads 13 may be performed under a gas flow. As an example, the insulator deposited during this step may be silicon oxide ($SiO_2$). A structure comprising a single-crystal silicon portion 11 formed on a portion of insulating layer 13, 15 which itself extends on single-crystal silicon wafer 1 is thus obtained.

To obtain a structure identical to that provided herein, a method comprising the growth, on a semiconductor wafer, of a portion of a silicon-germanium layer topped with a portion of a silicon layer may have been used. Then, an etching is performed, from a side of the silicon-germanium layer or from a hole formed in the silicon layer, to remove a portion of silicon-germanium layer. The silicon layer is then maintained above the semiconductor wafer by the remaining portion of the silicon-germanium layer. An to insulator is then deposited, in the same way as in the step of FIG. 1H, under the silicon layer and the remaining silicon-germanium is etched. However, if it is desired to form the stacking of the insulating layer portion and of the silicon layer portion on a relatively large surface area of the wafer, there is a risk for the silicon layer to collapse, due to its weight, once the etching of a portion of the silicon-germanium has been performed. The method according to an embodiment of the present invention enables avoiding this collapse phenomenon since, when silicon-germanium layer 3 is etched at the step of FIG. 1F, silicon layer 11 is maintained at several points by porous silicon pads 9. To avoid the collapse, the distance separating pads 9 must be properly specified. This enables forming, on a significant surface area of wafer 1, a structure comprising the stacking of insulating layer 15 and of silicon layer portion 11.

A structure formed of a silicon layer 11 extending on an insulating layer 15 formed on a portion only of a semiconductor wafer 1 has been described previously. However, this structure may also be formed on the entire surface of the semiconductor wafer.

Specific embodiments of the present invention have been described. Variation alterations, modifications and improvements will occur to those skilled in the art. In particular, openings 7 formed in mask 5 have been defined as having a square shape in top view. However, any other shape of openings then enabling obtaining holding pads may be envisaged, for example, rounded or hexagonal shapes. As a variation, openings 7 may also be strips in top view. In all cases, pads 9 must be close enough to avoid a collapsing of silicon layer 11 in the etch step of FIG. 1F, and they must not prevent the etching of the entire silicon-germanium layer 3.

As a variation, the insulating material of layer 15 may be any insulating material other than silicon oxide, for example, a nitride or a metal oxide having a high dielectric constant (so-called "high-k" material) such as hafnium dioxide ($HfO_2$) or zirconium dioxide ($ZrO_2$).

An advantage of the present invention is to enable forming, on a same silicon wafer, components directly formed in this silicon wafer, currently designed in the art as "bulk components" and components formed in a thin silicon-on-insulator layer.

Such alterations, modifications and improvements are intended to be within the spirit and scope of the invention. Accordingly, the foregoing description is by way of example only and is not intended to be limiting. The invention is limited only as defined in the following claims and the equivalent thereto.

What is claimed is:

1. A method, comprising:
    forming a silicon-germanium layer on at least a portion of a silicon wafer;
    transforming portions of the silicon-germanium layer into porous silicon pads;
    growing a single-crystal silicon layer on the silicon-germanium layer and on the porous silicon pads; and
    removing portions of the silicon-germanium layer that were not transformed into porous silicon pads, wherein removing portions of the silicon-germanium layer that were not transformed into porous silicon pads includes forming an empty spacing under the single-crystal silicon layer and between the porous silicon pads, such that the single-crystal silicon layer hangs on the porous silicon pads.

2. The method of claim 1, wherein the forming the silicon-germanium layer comprises epitaxially growing the silicon-germanium layer under a gas flow.

3. The method of claim 1, wherein the forming the silicon-germanium layer comprises forming the silicon-germanium layer to a thickness between about 10 nanometers and about 20 nanometers.

4. The method of claim 1, wherein the porous silicon pads are spatially separated.

5. The method of claim 1, wherein the transforming of the portions of the silicon-germanium layer into porous silicon pads comprises:
    forming, on the silicon-germanium layer, a mask having openings;
    performing electrolysis of the silicon-germanium layer exposed in the openings; and
    removing the mask.

6. The method of claim 1, wherein the transforming of the portions of the silicon-germanium layer into porous silicon pads comprises:
  forming, on the silicon-germanium layer, a mask having openings;
  etching the silicon-germanium layer exposed in the openings down to the silicon wafer;
  epitaxially growing silicon portions on the silicon wafer in the openings;
  performing electrolysis of the silicon portions; and
  removing the mask.

7. The method of claim 1, wherein the single-crystal silicon layer has a thickness between about 10 nanometers and about 20 nanometers.

8. The method of claim 1, wherein the porous silicon pads have dimensions smaller than about 1 µm and are spaced apart from one another by about 10 µm.

9. The method of claim 1, further comprising:
  oxidizing the porous silicon pads; and
  depositing an insulating material under the single-crystal silicon layer.

10. The method of claim 9, wherein the insulating material substantially fills a region previously filled with the silicon-germanium layer.

11. The method of claim 9, wherein the insulating material is a material other than silicon oxide.

12. The method of claim 1, further comprising forming vias in the single-crystal silicon layer.

13. A method, comprising:
  forming a first semiconductor layer on at least a portion of a semiconductor wafer;
  transforming portions of the first semiconductor layer into porous pads of semiconductor material;
  growing a single-crystal second semiconductor layer on the first semiconductor layer and on the porous pads; and
  removing portions of the first semiconductor layer that were not transformed into the porous pads, wherein transforming the portions of the first semiconductor layer into porous pads comprises:
    forming, on the first semiconductor layer, a mask having openings;
    etching the first semiconductor layer exposed in the openings down to the semiconductor wafer;
    epitaxially growing semiconductor portions on the semiconductor wafer in the openings;
    performing electrolysis of the semiconductor portions; and
    removing the mask.

14. The method of claim 13, wherein the forming the first semiconductor layer includes forming a silicon-germanium layer by epitaxially growing the silicon-germanium layer under a gas flow.

15. The method of claim 13, wherein the porous pads are spatially separated from each other.

16. The method of claim 13, wherein the transforming of the portions of the first semiconductor layer into porous pads comprises:
  forming, on the first semiconductor layer, a mask having openings;
  performing electrolysis of the first semiconductor layer exposed in the openings; and
  removing the mask.

17. The method of claim 13, wherein the porous pads have dimensions smaller than about 1 µm and are spaced apart from one another by about 10 µm.

18. The method of claim 13, further comprising:
  oxidizing the porous pads into silicon oxide; and
  depositing an insulating material under the single-crystal second semiconductor layer.

19. The method of claim 18, wherein the insulating material is a material different than silicon oxide.

20. A method comprising:
  forming silicon oxide pads on a silicon wafer; and
  forming a single-crystal silicon layer supported above the silicon wafer by the silicon oxide pads, wherein regions between the single-crystal silicon layer and the silicon wafer other than regions occupied by the silicon oxide pads are void of any material.

21. The method of claim 20, wherein forming the silicon oxide pads includes:
  forming a semiconductor layer on at least a portion of the wafer;
  transforming portions of the semiconductor layer into porous silicon pads;
  removing portions of the semiconductor layer that were not transformed into the porous silicon pads; and
  oxidizing the porous silicon pads.

22. The method of claim 21, wherein transforming of the portions of the first semiconductor layer into porous silicon pads comprises:
  forming, on the semiconductor layer, a mask having openings;
  performing electrolysis of the semiconductor layer exposed in the openings; and
  removing the mask.

23. The method of claim 21, wherein transforming the portions of the semiconductor layer into porous silicon pads comprises:
  forming, on the semiconductor layer, a mask having openings;
  etching the semiconductor layer exposed in the openings down to the silicon wafer;
  epitaxially growing semiconductor portions in the openings and on the silicon wafer;
  performing electrolysis of the semiconductor portions; and
  removing the mask.

24. The method of claim 20, further comprising:
  depositing an insulating material under the single-crystal silicon layer.

* * * * *